United States Patent [19]
Wang et al.

[11] Patent Number: 6,028,015
[45] Date of Patent: Feb. 22, 2000

[54] PROCESS FOR TREATING DAMAGED SURFACES OF LOW DIELECTRIC CONSTANT ORGANO SILICON OXIDE INSULATION MATERIAL TO INHIBIT MOISTURE ABSORPTION

[75] Inventors: Zhihai Wang, Sunnyvale; Wilbur G. Catabay, Saratoga; Joe W. Zhao, San Jose, all of Calif.

[73] Assignee: LSI Logic Corporation, Milpitas, Calif.

[21] Appl. No.: 09/281,514

[22] Filed: Mar. 29, 1999

[51] Int. Cl.$^7$ ................................................. H01L 21/469
[52] U.S. Cl. ..................... 438/789; 438/471; 438/475; 438/787; 438/790; 257/607; 257/629
[58] Field of Search ..................... 438/789, 790, 438/787, 788, 475, 471, 473; 257/607, 629

[56] References Cited

U.S. PATENT DOCUMENTS

| | | | |
|---|---|---|---|
| 4,331,486 | 5/1982 | Chenevas-Paule | 148/1.5 |
| 5,250,444 | 10/1993 | Khan et al. | 438/162 |
| 5,660,682 | 8/1997 | Zhao et al. | 438/715 |
| 5,744,202 | 4/1998 | Nickel | 427/527 |
| 5,888,856 | 3/1999 | Hamada | 438/162 |
| 5,946,585 | 8/1999 | Zhang et al. | 438/475 |

OTHER PUBLICATIONS

McClatchie, S., et al., "Low Dielectric Constant Oxide Films Deposited Using CVD Techniques", 1998 *Proceedings Fourth International DUMIC Conference,* Feb. 16–17, 1998, pp. 311–318.

Peters, Laura, "Pursuing the Perfect Low–k Dielectric", *Semiconductor International,* Sep., 1998, vol. 21, No. 10, pp. 64–66, 68, 70, 72, and 74.

*Primary Examiner*—Charles Bowers
*Assistant Examiner*—Hsien Min Lee

[57] ABSTRACT

A process is described for treating damaged surfaces of a low dielectric constant organo silicon oxide insulation layer of an integrated circuit structure to inhibit absorption of moisture which comprises treating such damaged surfaces of said organo silicon oxide insulation layer with a hydrogen plasma. The treatment with hydrogen plasma causes hydrogen to bond to silicon atoms with dangling bonds in the damaged surface of the organo silicon oxide layer to replace organic material severed from such silicon atoms at the damaged surface, whereby absorption of moisture in the damaged surface of the organo silicon oxide layer, by bonding of such silicon dangling bonds with moisture, is inhibited.

14 Claims, 2 Drawing Sheets

FORMING A LAYER OF A LOW DIELECTRIC CONSTANT INSULATION MATERIAL COMPRISING SILICON ATOMS BONDED TO OXYGEN ATOMS AND ORGANIC RADICALS ON A SEMICONDUCTOR SUBSTRATE

SUBJECTING SURFACE PORTIONS OF THE LOW DIELECTRIC CONSTANT INSULATION MATERIAL TO A TREATMENT THAT DAMAGES THESE SURFACE PORTIONS BY SEVERING BONDS BETWEEN THE SILICON ATOMS AND THE ORGANIC RADICALS

TREATING THE DAMAGED SURFACE PORTIONS OF THE LOW DIELECTRIC CONSTANT INSULATION MATERIAL BY EXPOSING SUCH DAMAGED SURFACE PORTIONS TO A HYDROGEN PLASMA TO REPAIR THE DAMAGE BY BONDING HYDROGEN TO SILICON ATOMS NO LONGER BONDED TO ORGANIC RADICALS

FIG. 4

PROCESS FOR TREATING DAMAGED SURFACES OF LOW DIELECTRIC CONSTANT ORGANO SILICON OXIDE INSULATION MATERIAL TO INHIBIT MOISTURE ABSORPTION

BACKGROUND OF THE INVENTION

1. Field of the Invention

This invention relates to integrated circuit structures constructed on semiconductor substrates. More particularly, this invention relates to a process for treating damaged surfaces in low dielectric constant organo silicon oxide insulation material to inhibit moisture absorption by such damaged low dielectric constant insulation material.

2. Description of the Related Art

In the construction of integrated circuit structures, dielectric materials such as silicon oxide ($SiO_2$) have been conventionally used to electrically separate and isolate or insulate conductive elements of the integrated circuit structure from one another. However, as the spacing between such conductive elements in the integrated circuit structure have become smaller and smaller, the capacitance between such conductive elements through the silicon oxide dielectric has become of increasing concern. Such capacitance has a negative influence on the overall performance of the integrated circuit structure in a number of ways, including its effect on speed of the circuitry and cross-coupling (crosstalk) between adjacent conductive elements.

Because of this ever increasing problem of capacitance between adjacent conductive elements separated by silicon oxide insulation, as the scale of integrated circuit structures continues to reduce, the use of other insulation materials having lower dielectric constants than conventional silicon oxide ($SiO_2$) has been proposed. One such material is a methyl silicon oxide material wherein at least a portion of the oxygen atoms bonded to the silicon atoms are replaced by methyl ($CH_3$—) groups. Such a methyl silicon oxide dielectric material has a dielectric constant of about 2.9 and is, therefore, of great interest as a low dielectric constant substitute for the conventional silicon oxide ($SiO_2$) insulation material.

While the substitution of one or more methyl groups for some of the oxygen atoms bonded to the silicon atoms has a beneficial effect in the lowering of the dielectric constant of the organo silicon oxide material, therefore lowering the capacitance between conductive elements separated by such dielectric material, it has been found that the bond formed between the silicon atoms and the methyl group is not as stable as the silicon-oxygen bond found in conventional silicon oxide ($SiO_2$) materials.

In particular, for example, when the surface of such a low dielectric constant methyl silicon oxide insulation layer is exposed to oxidizing or "ashing" systems, which are used to remove a photoresist mask from the low dielectric constant methyl silicon oxide insulation layer, after formation of openings therein, it has been found that the ashing process results in damage to the bonds (severance) between the methyl radicals and the silicon atoms adjacent the surfaces of the low dielectric constant methyl silicon oxide insulation layer exposed to such an ashing treatment. The term "openings", as used herein, is intended to describe either vias between two layers of metal interconnects or contact openings between devices on the substrate and a metal interconnect layer. This severance of the carbon-silicon bonds, in turn, results in removal of such organic materials formerly bonded to the silicon atoms along with the organic photoresist materials being removed from the integrated circuit structure. The silicon atoms from which the methyl radicals have been severed, and which are left in the damaged surface of the low dielectric constant methyl silicon oxide insulation layer, have dangling bonds which are very reactive and become water absorption sites if and when the damaged surface is exposed to moisture. The damaged low dielectric constant methyl silicon oxide insulation layer, and its resultant susceptibility to moisture may be illustrated by the following equations:

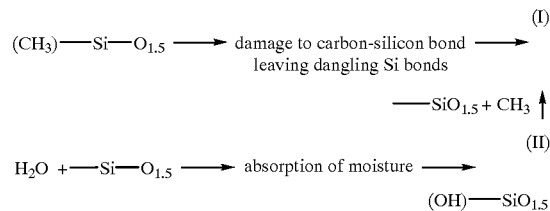

This absorption of moisture by the damaged low dielectric constant methyl silicon oxide insulation material, results in hydroxyl bonding to the dangling silicon bonds left from the severance of the carbon-silicon bonds in the damaged surface of the low dielectric constant methyl silicon oxide insulation layer. This silicon-hydroxyl bond is not a stable bond and subsequent exposure to heat, e.g., during subsequent processing such as annealing, can result in severance of the silicon-hydroxyl bond, thereby causing water vapor formation which, for example, can interfere with subsequent filling of a via/contact opening or a damacene trench with metal filler material. It would, therefore, be desirable to repair any damage done to the low dielectric constant methyl silicon oxide insulation layer by the severance of the carbon-silicon bonds prior to any exposure of the damaged surface to moisture to thereby ensure against formation of unstable silicon-hydroxyl bonds in the damaged surface of the low dielectric constant methyl silicon oxide insulation layer.

SUMMARY OF THE INVENTION

The invention comprises a process for treating damaged surfaces of a low dielectric constant organo silicon oxide insulation layer of an integrated circuit structure to inhibit absorption of moisture. The process comprises treating such damaged surfaces of a low dielectric constant organo silicon oxide insulation layer, such as a methyl silicon oxide insulation layer, with a hydrogen plasma. The treatment with hydrogen plasma causes hydrogen to bond to those silicon atoms having dangling bonds which are left in the damaged surface of the low dielectric constant methyl silicon oxide insulation layer to replace methyl groups severed from such silicon atoms at the damaged surface. Absorption of moisture in the damaged surface of the low dielectric constant methyl silicon oxide insulation layer, by bonding of such silicon with moisture, is thereby inhibited.

BRIEF DESCRIPTION OF THE DRAWINGS

FIG. 4 is a flowsheet illustrating the process of the invention.

DETAILED DESCRIPTION OF THE INVENTION

Figure 1:
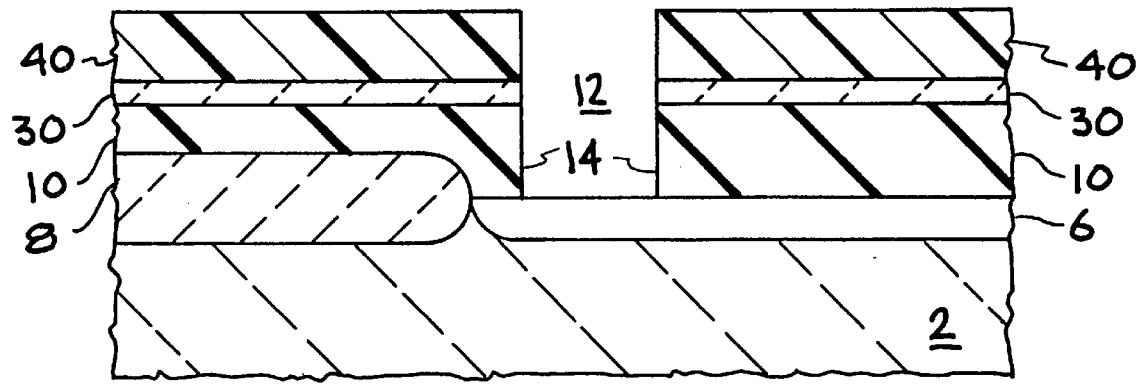
FIG. 1 is a fragmentary vertical cross-sectional view of an integrated circuit structure having a low dielectric constant methyl silicon oxide insulation layer formed over a semiconductor substrate and a contact opening etched in the insulation layer through a resist mask formed over a protective capping layer formed on the upper surface of the low dielectric constant methyl silicon oxide insulation layer.

Referring now to FIG. 1, a semiconductor substrate is shown at 2 having a low dielectric constant methyl silicon oxide insulation layer 10 formed thereon with a opening 12 etched in insulation layer 10 through a resist mask 40 formed over a protective capping layer 30 on insulation layer 10. Low dielectric constant methyl silicon oxide insulation layer 10 comprises a modified silicon oxide ($SiO_2$) insulation layer formed using a methyl-substituted silane. Opening 12, in the illustrated embodiment, comprises a contact opening which will be subsequently filled with an electrically conductive material. Such a contact opening will provide an electrical connection between a metal line (not shown), which will be subsequently formed over insulation layer 10 and capping layer 30, and a portion of an integrated circuit device, such as illustrated source/drain region 6 of an MOS transistor, formed in substrate 2 adjacent field oxide insulation 8. The formation of opening 12 in insulation layer 10 results in exposure of sidewall surfaces 14 comprising an etched portion of low dielectric constant insulation methyl silicon oxide layer 10.

Figure 2:
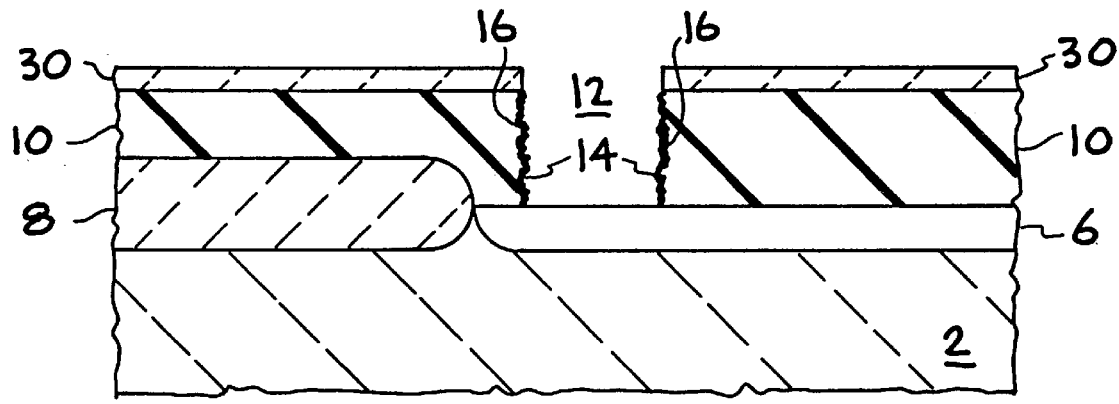
FIG. 2 is a fragmentary vertical cross-sectional view of the structure of FIG. 1 with the resist mask removed, illustrating damage to the exposed sidewall surfaces of the contact opening formed in the low dielectric constant methyl silicon oxide insulation layer.

FIG. 2 shows the structure of FIG. 1 after subjecting the structure to an oxidation or ashing process to remove resist mask 40. As seen in FIG. 2, exposed sidewalls 14 of opening 12 in low dielectric constant methyl silicon oxide insulation layer 10 are shown having damaged portions 16 adjacent to the surfaces of sidewalls 14 resulting from contact of these exposed surfaces of opening 12 in layer 10 with the oxidizing or ashing treatment used to remove resist mask 40.

Figure 3:
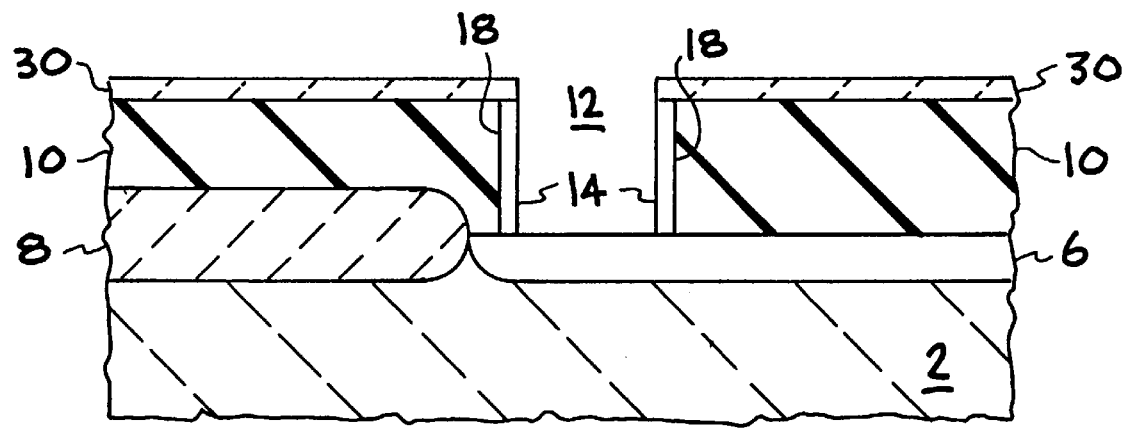
FIG. 3 is a fragmentary vertical cross-sectional view of the structure of FIG. 2, illustrating the sidewall surfaces of the contact opening in the low dielectric constant methyl silicon oxide insulation layer after treatment with a hydrogen plasma in accordance with the invention.

Referring now to FIG. 3, it will be noted that the damaged portions 16 of the exposed surface sidewalls 14 of opening 12 in layer 10 have been replaced by treated portions 18. In accordance with the invention, damaged portions 16 of low dielectric constant methyl silicon oxide insulation layer 10 are treated with a hydrogen plasma to cause hydrogen from the plasma to bond to the silicon atoms with dangling bonds, i.e., those silicon atoms previously bonded to organic radicals stripped from the silicon atoms by exposure to the oxidizing/ashing treatment used to remove resist mask 40. The hydrogen from the hydrogen plasma thus replaces the lost organic radicals by bonding to the silicon, thereby reducing or eliminating unbonded silicon on these exposed surfaces. Subsequent exposure of the structure to moisture will, therefore, not result in any significant absorption of moisture by the exposed surfaces of layer 10 because substantially all of the silicon atoms with previously severed bonds are now bonded to hydrogen and thus are unavailable for bonding with hydroxyl ions in the moisture.

While we do not wish to be bound by any theories, it appears that the initial treatment of the silicon oxide insulation layer with an organic material to form the low dielectric constant methyl silicon oxide insulation material apparently results in replacement of some of the oxygen atoms bonded to the silicon with organic radicals, i.e., the silicon atoms form bonds with the organic radicals instead of oxygen atoms. Then when the structure is exposed to an etchant system which removes the organic photoresist mask, i.e., an oxidizing or ashing system, some of the bonds between the silicon atoms and the organic radicals are apparently also broken, leaving highly reactive silicon atoms with dangling bonds in the exposed sidewall surfaces of the contact openings formed in the low dielectric constant insulation material. This, in turn, leaves such surfaces vulnerable to subsequent absorption of moisture in which hydroxyl ions bond to the highly reactive silicon atoms with the broken bonds adjacent the exposed surfaces of the contact openings in the low dielectric constant insulation material.

The hydrogen plasma, used to supply the hydrogen for the silicon-hydrogen bonds to be formed at the damaged sidewall surfaces of opening 12, is formed by flowing hydrogen gas into a vacuum (airtight) chamber which may be maintained at a pressure ranging from as high as 760 Torr (ambient pressure) to as low 0.01 milliTorr, with the gas flow adjusted according to both the desired pressure, as well as the size of the treatment chamber. For example, in a five liter volume chamber, the flow of hydrogen gas may vary from as little as 1 sccm for low pressure conditions to as high as 200 sccm for ambient pressure operating conditions. For other size chamber, flow ranges equivalent to such flow rates for a five liter chamber can be derived from these ranges. A non-reactive gas such as, for example, helium, neon, or argon may also be flowed into the chamber with the hydrogen gas, particularly at higher operating pressures. Any power supply capable of igniting and maintaining the hydrogen plasma in the chamber may be utilized. Typically, for a five liter chamber, the plasma generating power supply may vary from about 30 to about 1000 watts, and preferably from about 100 to about 300 watts. For other chamber sizes, the plasma power requirements will be scaled up or down accordingly, as with the previously mentioned flow rates, and the actual power ranges needed for such chambers will be equivalent to the above recited ranges for a five liter chamber. An optional bias of from 0 to about 300 volts may be applied to the wafer. The maximum amount of wafer bias, however, must not exceed an amount which will still permit the plasma to interact with the sidewalls of the via.

As an example, if a semiconductor substrate containing the low dielectric constant methyl silicon oxide insulating layer with the damaged surface is treated in a five liter chamber, the flow of hydrogen will about 5 sccm while a pressure of 0.5 milliTorr would be maintained, and the power supplied to the plasma will be about 300 watts. The hydrogen plasma treatment, regardless of chamber size, is usually carried out for a period of time ranging from about 1–2 seconds to about ten minutes.

To further illustrate the practice of the invention and its beneficial results on the subsequent filling with metal of openings formed in low dielectric constant methyl silicon oxide insulation layers, two 8 inch diameter silicon wafers can be each coated with a one micrometer ($\mu$m) thick layer of the same low dielectric constant methyl silicon oxide insulation material, having at least 8 wt. % carbon content. A 30 nm silicon oxide capping layer may be applied by CVD over the low dielectric constant methyl silicon oxide insulation layer on each of the two wafers. Identical photoresist masks would then be applied over the respective capping layers on the two wafers and a plurality of openings having aspect ratios of about 3:1 can then be etched through the mask into and through the respective low dielectric constant methyl silicon oxide insulation layers on each of the two wafers, using a conventional $CF_4$ and $H_2$ plasma etchant system which is selective to silicon.

The respective resist masks wold then be removed from both wafers by a standard ashing process consisting of an $O_2$ plasma. At this point, however, the low dielectric constant methyl silicon oxide insulation layer on one of the wafers would then be treated with a hydrogen plasma, in accordance with the invention, while the low dielectric constant methyl silicon oxide insulation layer on the other wafer (acting as the control) would not be so treated. The wafer to be treated would be placed in a five liter hydrogen plasma treatment chamber and about 30 sccm of hydrogen would then be flowed through the chamber while a vacuum of about 20 milliTorr would be maintained. A plasma would be ignited in the chamber and maintained at a power level of about 1000 watts for 1 minute. The wafer with the treated low dielectric constant methyl silicon oxide insulation layer would then be removed from the hydrogen plasma treatment chamber and both wafers would then be subjected to conventional titanium, titanium nitride, and tungsten depositions to fill the openings formed in the low dielectric constant methyl silicon oxide insulation layers on each wafer by sputtering about 30 nm of titanium metal, then about 30 nm of titanium nitride, and finally sputtering about 300 nm of tungsten metal over the respective low dielectric constant methyl silicon oxide insulation layer on both wafers, followed by planarizing the three layers down to the level of the top surface of the respective low dielectric constant methyl silicon oxide insulation layers.

Physical examination of both wafers can then be carried out to determine complete filling of each opening with tungsten. It will be found that substantially all of the openings formed in the low dielectric constant methyl silicon oxide insulation layer treated with the hydrogen plasma in accordance with the invention are filled. In contrast, examination of the control wafer with the untreated low dielectric constant methyl silicon oxide insulation layer would reveal that only some of the openings were filled with tungsten, indicating that the untreated sidewall surfaces of the openings in the low dielectric constant methyl silicon oxide insulation layer interfered with the filling of at least some of the openings with tungsten, apparently through absorption of moisture by the damaged and untreated surfaces.

To confirm such a visual examination, metal contacts could be formed over each opening in the low dielectric constant methyl silicon oxide insulation layers on both wafers. A 2 volt potential can be applied to the contacts and the current flow from the contact to the wafer would then be measured and compared. Such a test would confirm that substantially all of the openings in the treated low dielectric constant methyl silicon oxide insulation layer were filled with tungsten, while less than all of the openings in the untreated low dielectric constant methyl silicon oxide insulation layer on the control wafer were filled.

It should be noted that while the invention has been particularly described with respect to the treatment of surfaces of vias or contact openings in a low dielectric constant methyl silicon oxide insulation layer, the process of the invention has application in the treatment of any exposed surfaces of a low dielectric constant methyl silicon oxide insulation layer, regardless of the function of or reason for the exposed surface. For example, if a protective capping layer, such as illustrated capping layer 30, is not formed over the low dielectric constant methyl silicon oxide insulation layer (between the low dielectric constant methyl silicon oxide insulation layer and the resist mask), then this upper surface of the low dielectric constant methyl silicon oxide insulation layer would also be damaged during the removal of the resist mask, and would need to be treated by the process of the invention after removal of the resist mask. The treatment of the invention would also have application where a layer of metal interconnects is formed from a metal such as copper which does not pattern well, and the insulation layer is first deposited and patterned prior to deposition of the metal into the patterned trenches (the so-called damacene process). If the insulation layer comprises a low dielectric constant methyl silicon oxide insulation layer, then the process of the invention should be used to treat the damaged surfaces of the low dielectric constant methyl silicon oxide insulation layer after formation of the pattern of trenches therein and removal of the resist mask, and prior to the metal deposition step or steps.

Etch residues and copper oxide residues may then be removed following such treatment, using the etch residue removal process described in U.S. Patent Application Docket No. B3-4293 entitled PLASMA CLEANING PROCESS FOR OPENINGS FORMED IN ONE OR MORE LOW DIELECTRIC CONSTANT INSULATION LAYERS OVER COPPER METALLIZATION IN INTEGRATED CIRCUIT STRUCTURES which was filed by two of us with another on the same day as this application, and is assigned to the assignee of this application, which is designed to inhibit sputtering of copper during removal of the etch residues and copper oxides from underlying copper layers.

Thus, the invention provides a treatment process which repairs damage to a low dielectric constant methyl silicon oxide insulation layer caused by exposure of surfaces of the insulation layer to treatments to remove organic materials, such as the oxidizing or ashing process used to remove resist masks. Reactive silicon in the insulation layer, apparently resulting from the breaking of bonds between the silicon atoms and organic radicals during such oxidizing or ashing treatments, is treated with a hydrogen plasma to cause hydrogen to bond with such silicon atoms, thus inhibiting subsequent absorption of moisture by such a damaged insulation layer.

Having thus described the invention what is claimed is:

1. A process for protecting a low dielectric constant organo silicon oxide insulation layer of an integrated circuit structure against absorption of moisture which comprises treating exposed surfaces of said organo silicon oxide insulation layer with hydrogen.

2. The process of claim 1 which further includes treating said exposed surfaces of said low dielectric constant organo silicon oxide insulation layer with a hydrogen plasma.

3. The process of claim 2 wherein said exposed surfaces of said low dielectric constant organo silicon oxide insulation layer are treated with said hydrogen plasma for a period of time ranging from about 1 second to about 10 minutes.

4. In a process wherein a low dielectric constant organo silicon oxide insulation layer is exposed to a treatment which severs one or more organo-silicon bonds in said layer, the step of treating exposed surfaces of said low dielectric constant organo silicon insulation layer with said severed organo-silicon bonds to a hydrogen plasma.

5. The process of claim 4 wherein said step of exposing said low dielectric constant organo silicon oxide insulation layer having said severed organo-silicon bonds to a hydrogen plasma causes hydrogen from said hydrogen plasma to bond to silicon from said severed organo-silicon bonds to replace the organic material severed from said silicon, whereby absorption of moisture in said low dielectric constant organo silicon oxide insulation layer is inhibited.

6. The process of claim 4 wherein said exposed surfaces of said low dielectric constant organo silicon oxide insulation layer are treated with said hydrogen plasma for a period of time ranging from about 1 second to about 10 minutes.

7. The process of claim 4 wherein said exposed surfaces of said low dielectric constant organo silicon oxide insulation layer are treated with said hydrogen plasma while maintaining a plasma power equivalent to a range of from about 30 watts to about 600 watts for a five liter plasma chamber.

8. The process of claim 4 wherein said exposed surfaces of said low dielectric constant organo silicon oxide insulation layer are treated with said hydrogen plasma while flowing hydrogen into said chamber at a rate equivalent to flowing from about 1 sccm to about 200 sccm of hydrogen into a five liter plasma chamber.

9. In a process wherein a low dielectric constant organo silicon oxide insulation layer is damaged by exposure to a treatment which severs one or more organo-silicon bonds at one or more surfaces of said layer, leaving reactive silicon at said one or more surfaces capable of absorbing moisture, the step of treating said damaged low dielectric constant organo silicon insulation layer with a hydrogen plasma to cause hydrogen from said hydrogen plasma to react with said reactive silicon in said low dielectric constant organo silicon oxide insulation layer, whereby absorption of moisture by said low dielectric constant organo silicon oxide insulation layer will be inhibited.

10. The process of claim 9 wherein said damaged low dielectric constant organo silicon oxide insulation layer is treated with said hydrogen plasma for a period of time ranging from about 1 second to about 10 minutes to form bonds between said reactive silicon and hydrogen from said hydrogen plasma.

11. The process of claim 9 wherein said damaged low dielectric constant organo silicon oxide insulation layer is treated with said hydrogen plasma while maintaining a plasma power equivalent to a range of from about 30 watts to about 1000 watts for a five liter plasma chamber.

12. The process of claim 9 wherein said damaged low dielectric constant organo silicon oxide insulation layer is treated with said hydrogen plasma while maintaining a plasma power equivalent to a range of from about 100 watts to about 300 watts for a five liter plasma chamber.

13. The process of claim 9 wherein said damaged low dielectric constant organo silicon oxide insulation layer is treated with said hydrogen plasma while flowing a mixture of hydrogen and an inert gas into said chamber.

14. The process of claim 13 wherein said damaged low dielectric constant organo silicon oxide insulation layer is treated with said hydrogen plasma while flowing said hydrogen gas into said chamber at a rate equivalent to flowing from about 1 sccm to about 200 sccm of hydrogen into a five liter plasma chamber.

\* \* \* \* \*